(12) United States Patent
Ghosh et al.

(10) Patent No.: US 11,848,269 B2
(45) Date of Patent: Dec. 19, 2023

(54) TECHNIQUES TO CREATE POWER CONNECTIONS FROM FLOATING NETS IN STANDARD CELLS

(71) Applicant: Advanced Micro Devices, Inc., Santa Clara, CA (US)

(72) Inventors: Partha Pratim Ghosh, Santa Clara, CA (US); Pratap Kumar Das, Bangalore (IN); Prasanth M, Bangalore (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 243 days.

(21) Appl. No.: 17/493,574

(22) Filed: Oct. 4, 2021

(65) Prior Publication Data

US 2023/0107306 A1   Apr. 6, 2023

(51) Int. Cl.
*H01L 21/00* (2006.01)
*H01L 23/528* (2006.01)
*H01L 27/02* (2006.01)
*H01L 21/768* (2006.01)

(52) U.S. Cl.
CPC ...... *H01L 23/528* (2013.01); *H01L 21/76895* (2013.01); *H01L 27/0207* (2013.01)

(58) Field of Classification Search
CPC ............. H01L 23/528; H01L 21/76895; H01L 27/0207
See application file for complete search history.

(56) References Cited

U.S. PATENT DOCUMENTS

| 4,780,845 | A  | * | 10/1988 | Threewitt | ............ | G11C 15/043 |
| | | | | | | 365/182 |
| 5,731,760 | A  | * | 3/1998 | Ramirez | ................ | G11C 17/18 |
| | | | | | | 340/638 |
| 6,096,639 | A  | * | 8/2000 | Dawson | ............ | H01L 21/76895 |
| | | | | | | 257/E21.59 |
| 6,255,845 | B1 | * | 7/2001 | Wong | ................. | H03K 19/1736 |
| | | | | | | 326/38 |
| 6,417,556 | B1 | * | 7/2002 | Long | .................. | H01L 27/0805 |
| | | | | | | 257/532 |
| 10,438,937 | B1 | * | 10/2019 | Schultz | ............... | H01L 23/5286 |
| 2004/0024949 | A1 | * | 2/2004 | Winkler | .................. | G06F 13/36 |
| | | | | | | 710/315 |

(Continued)

FOREIGN PATENT DOCUMENTS

CN        115763470 A  *  3/2023  ............... G06F 1/26
DE      60126800 T2  * 11/2007  ............. G11C 15/00

(Continued)

Primary Examiner — Laura M Menz
(74) Attorney, Agent, or Firm — KOWERT HOOD MUNYON RANKIN AND GOETZEL PC; Rory D. Rankin

(57) ABSTRACT

A system and method for creating layout for standard cells are described. In various implementations, a floating metal net in the metal zero layer of a standard cell is selected for conversion to a power rail. The metal zero layer is a lowest metal layer above the gate region of a transistor. A semiconductor process (or process) forms a power rail in a metal zero track reserved for power rails. The process forms another power rail in a metal zero track reserved for floating metal nets, and electrically shorts the two power rails using a local interconnect layer between the two power rails. The charging and discharging times of a source region physically connected to the two power rails decreases.

20 Claims, 5 Drawing Sheets

(56) References Cited

U.S. PATENT DOCUMENTS

| | | | | |
|---|---|---|---|---|
| 2014/0068535 A1* | 3/2014 | Babu | ................... | G06F 30/394 |
| | | | | 716/111 |
| 2019/0155979 A1* | 5/2019 | Schultz | ............... | H01L 27/0207 |
| 2021/0175171 A1* | 6/2021 | Jung | ................... | H01L 27/0207 |
| 2022/0343053 A1* | 10/2022 | Dia | ....................... | G06F 30/398 |
| 2023/0073878 A1* | 3/2023 | Yu | ......................... | H03K 3/027 |
| 2023/0092184 A1* | 3/2023 | Schultz | ................ | G06F 30/394 |
| | | | | 257/773 |
| 2023/0096037 A1* | 3/2023 | Schultz | .................. | H01L 21/84 |
| | | | | 257/66 |
| 2023/0096652 A1* | 3/2023 | Schultz | ............... | H01L 21/8238 |
| | | | | 257/66 |
| 2023/0096892 A1* | 3/2023 | Schultz | ............... | H01L 27/0207 |
| | | | | 365/154 |
| 2023/0102901 A1* | 3/2023 | Schultz | ............. | H01L 29/66666 |
| | | | | 257/213 |
| 2023/0106921 A1* | 4/2023 | Ghosh | ................ | H01L 23/5286 |
| | | | | 257/773 |
| 2023/0107306 A1* | 4/2023 | Ghosh | ................ | H01L 27/0207 |
| | | | | 257/773 |
| 2023/0112432 A1* | 4/2023 | Wuu | ....................... | G06F 1/00 |
| | | | | 711/154 |

FOREIGN PATENT DOCUMENTS

| | | | | | |
|---|---|---|---|---|---|
| DE | 102022109400 A1 | * | 10/2022 | ......... | G06F 30/3312 |
| EP | 1070348 B1 | * | 3/2014 | ....... | H01L 21/76895 |
| WO | WO-9952146 A1 | * | 10/1999 | ....... | H01L 21/76895 |
| WO | WO-2021041687 A1 | * | 3/2021 | ........... | G06F 30/392 |
| WO | WO-2023056167 A1 | * | 4/2023 | ............. | H01L 21/84 |

* cited by examiner

TECHNIQUES TO CREATE POWER CONNECTIONS FROM FLOATING NETS IN STANDARD CELLS

BACKGROUND

Description of the Relevant Art

As both semiconductor manufacturing processes advance and on-die geometric dimensions reduce, semiconductor chips provide more functionality and performance while consuming less space. While many advances have been made, design issues still arise with modern techniques in processing and integrated circuit design that may limit potential benefits. For example, as the number and size of signal routes used in a design increase, the area consumed by the corresponding metal wires also increases. Therefore, signal congestion occurs. Further, to meet desired high performance, transistor sizes are increased to improve drive strength and reduce response times of the transistor. However, the increased transistor sizes consume more on-die area, which can increase the size of a standard cell and increase power consumption.

In view of the above, efficient methods and systems for creating layout of standard cells are desired.

Figure 1:
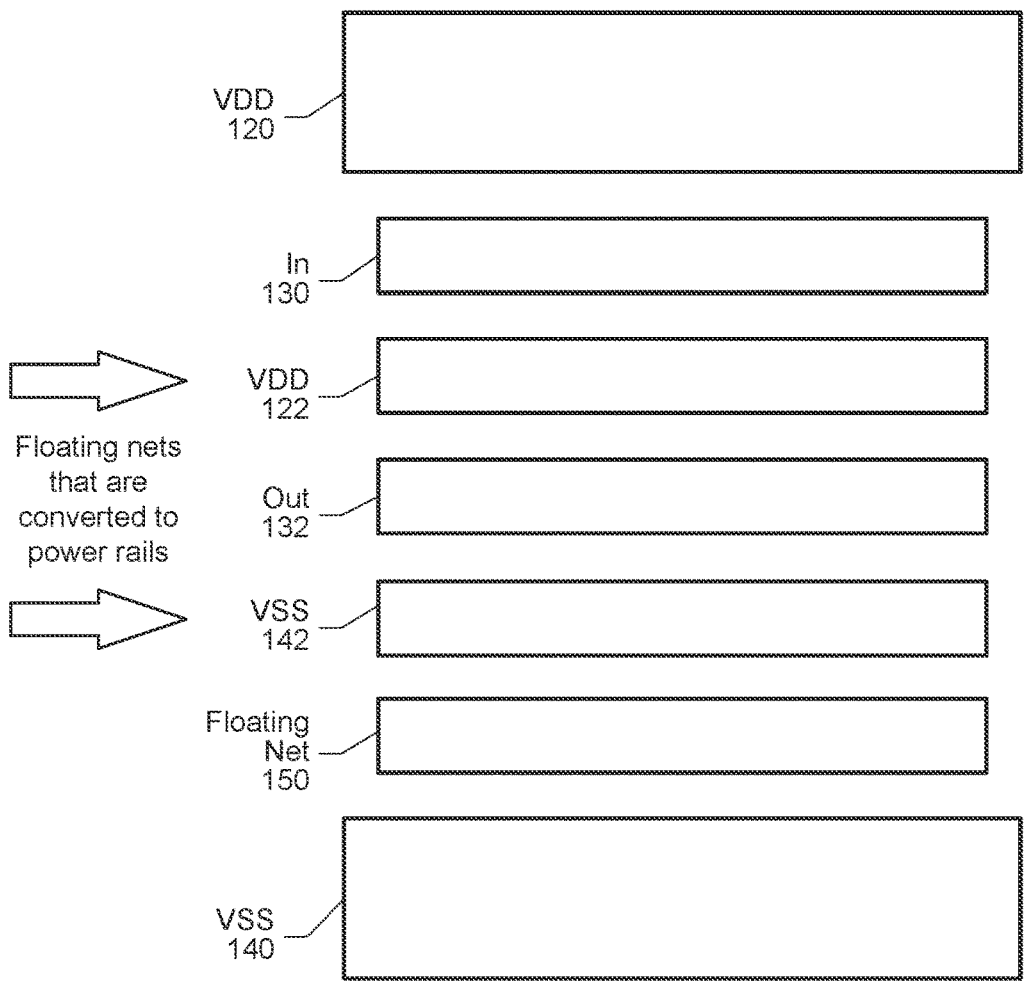
FIG. 1 is a generalized diagram of a top view of metal layers of a standard cell layout utilizing multiple power rails shorted together.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for efficiently creating layout of standard cells are contemplated. In various implementations, a semiconductor fabrication process (or process) forms two power rails in a standard cell. The process forms the two power rails (or power connections) in a metal zero layer that is a lowest metal layer above the gate region of a transistor. The two power rails provide a same power supply reference voltage level or a same ground reference voltage level. The process forms the first power rail in a metal zero track reserved for power rails, whereas, the process forms the second power rail in a track reserved for control or data signal routes or reserved for a floating metal net. Therefore, the process does not form the second power rail in a metal zero track reserved for power rails.

The process forms, in the standard cell, a signal route of a local interconnect layer such that the signal route is physically connected to each of the first and the second power rails. The local interconnect layer is below the metal zero layer and at a same layer level as the gate region of the transistor. Each of the local interconnect layer and the first and the second power rails are electrically connected to one another. In various implementations, the local interconnect layer has a physical connection to a source region of a transistor in the standard cell. Therefore, during operation, this source region has current flowing into it from two different power rails when the power rails are connected to a power supply reference voltage level and the source region is a component of a p-type transistor (device). Alternatively, during operation, this source region has current flowing from it toward two different power rails when the power rails are connected to a ground reference voltage level and the source region is a component of an n-type transistor (device).

Figure 2:
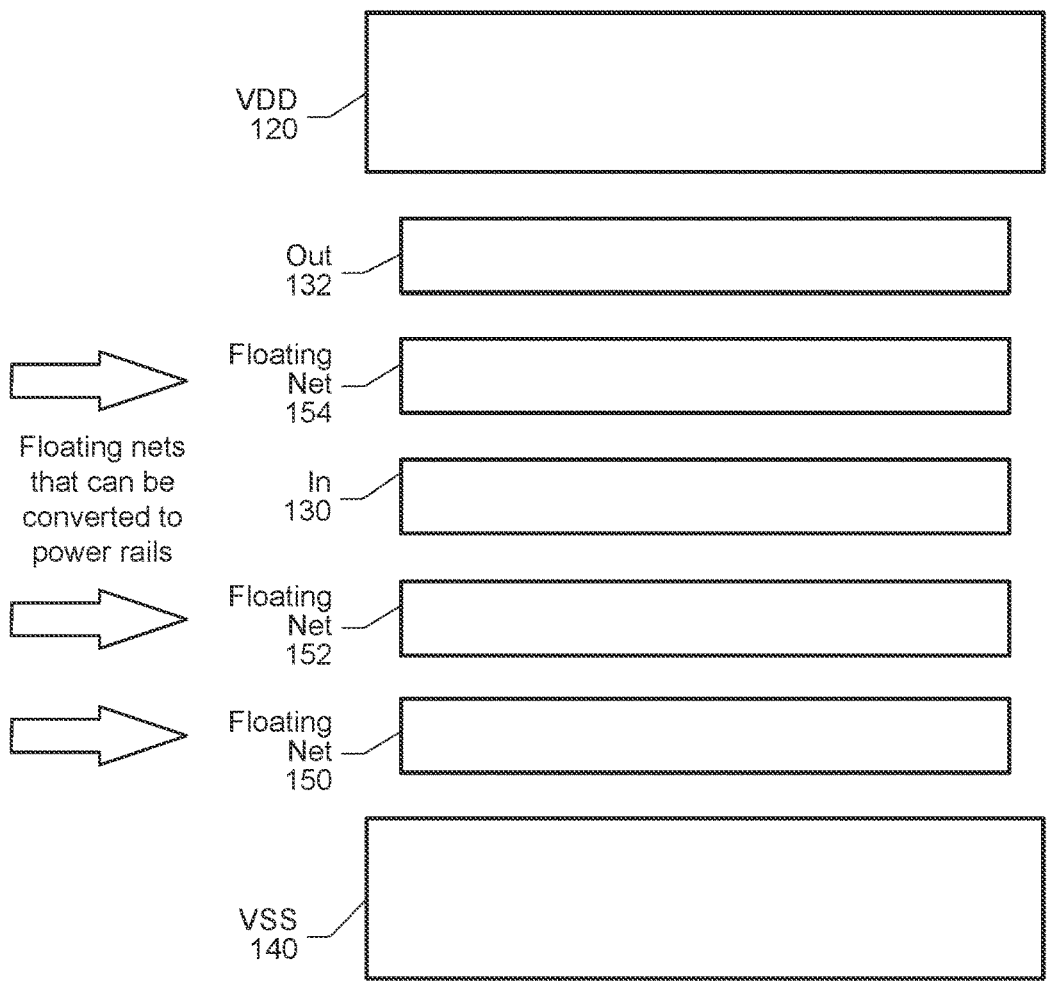
FIG. 2 is a generalized diagram of a top view of metal layers of a standard cell layout.
Figure 3:
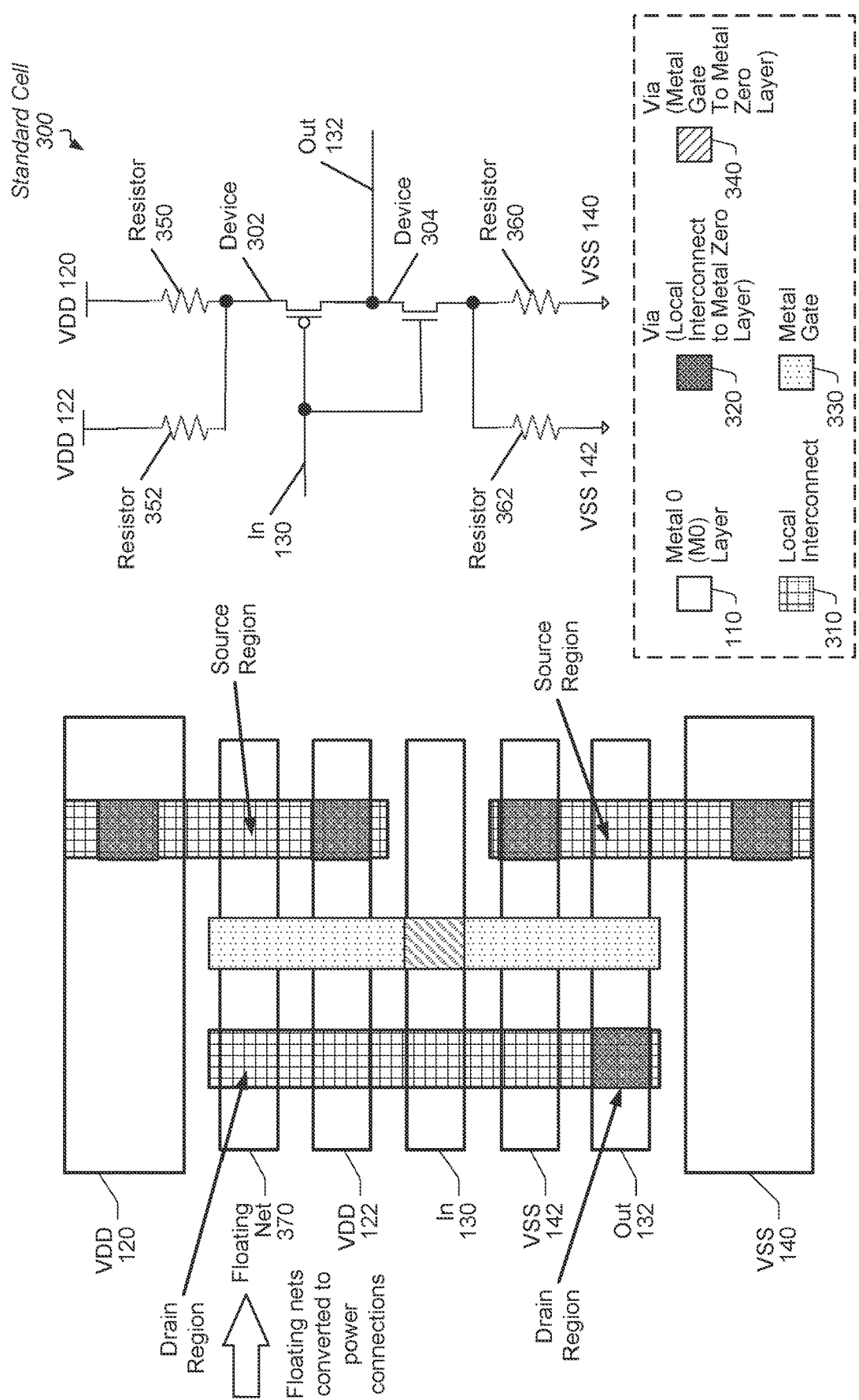
FIG. 3 is a generalized diagram of metal layers of layout of a standard cell and a schematic of the standard cell.
Figure 4:
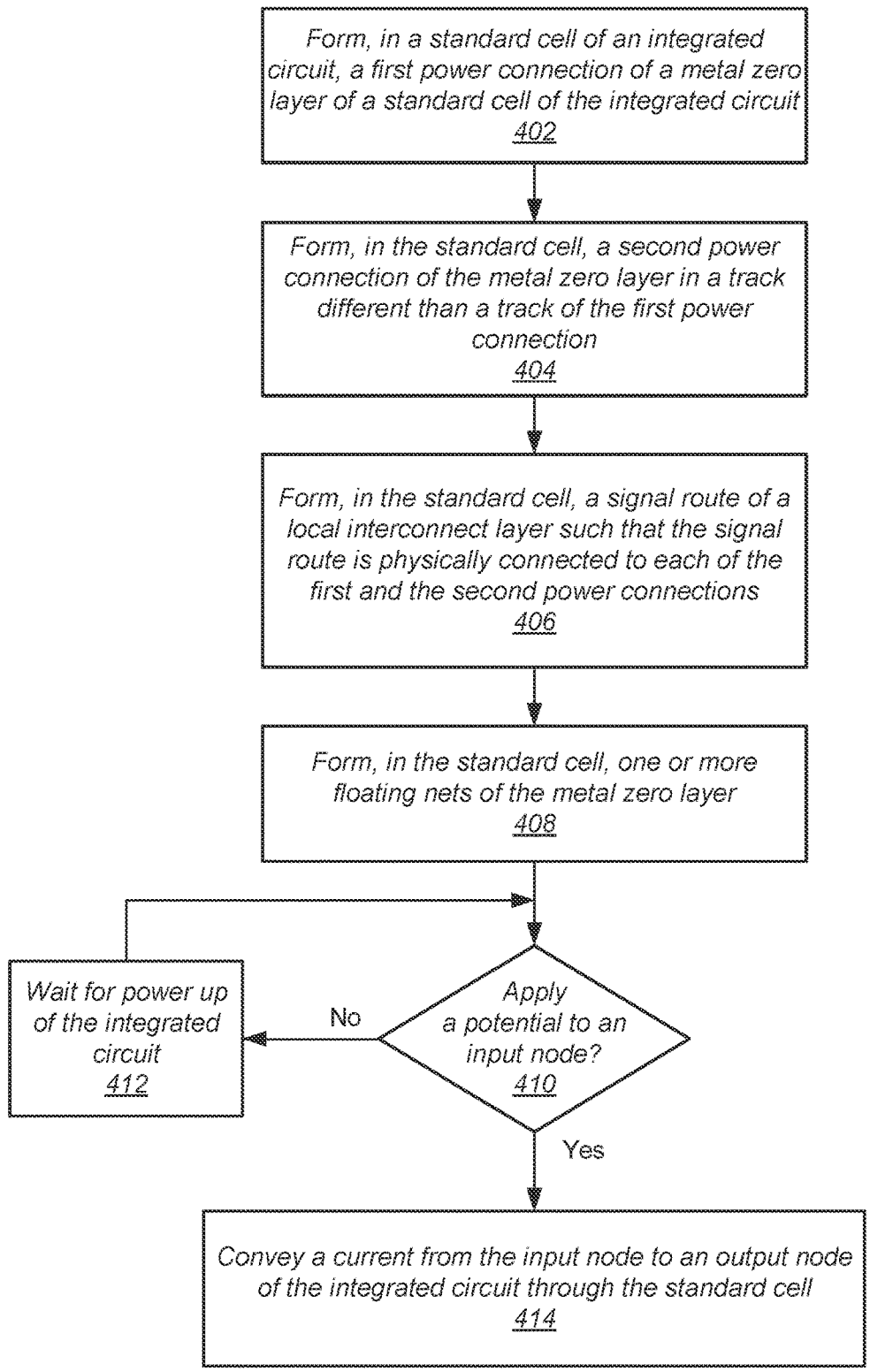
FIG. 4 is a generalized diagram of one embodiment of a method for creating multiple power rails of a standard cell shorted together using a local interconnect layer.
Figure 5:
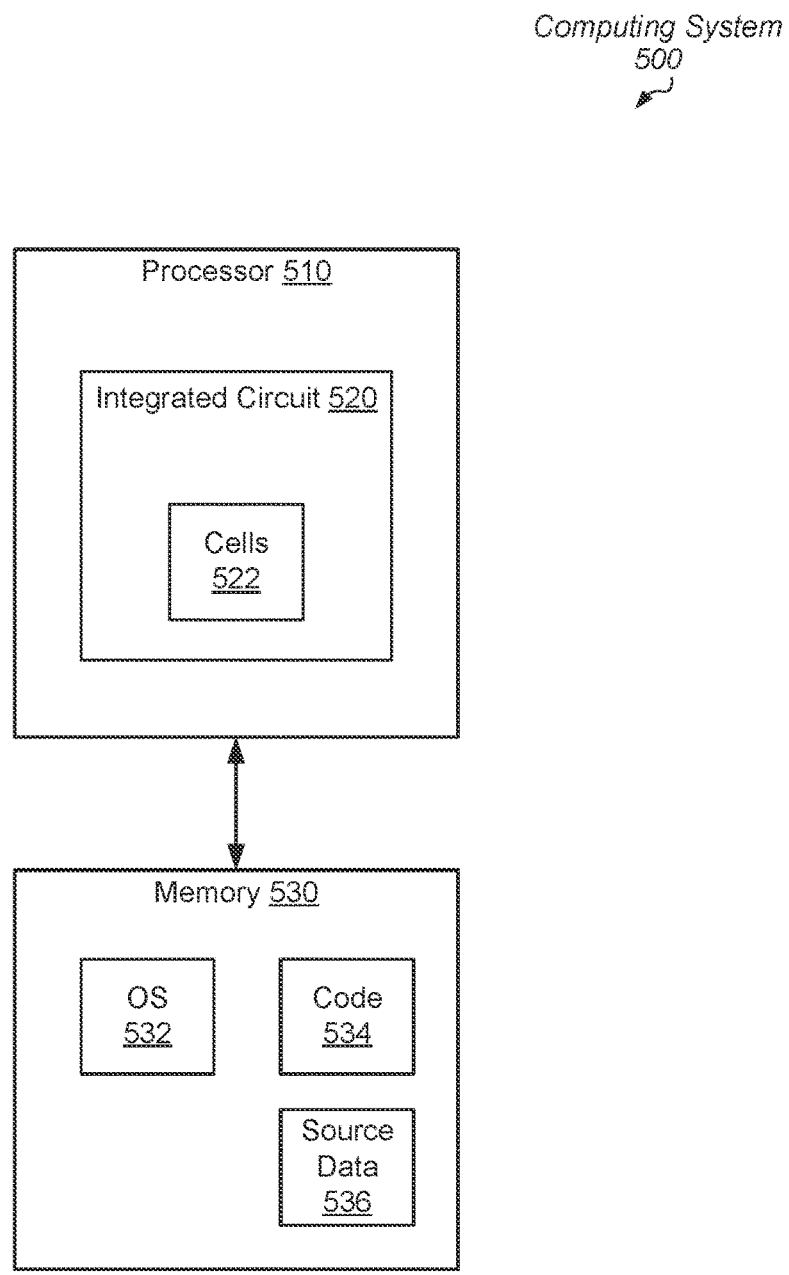
FIG. 5 is a generalized diagram of a top view of a computing system.

The process forms, in the standard cell, one or more floating metal nets of the metal zero layer. In some implementations, the process forms the floating metal nets and selects one to be the second power rail. These floating metal nets have no physical or electrical connection to any power supply reference voltage level or ground reference voltage level. The one or more floating metal nets of the metal zero layer provide higher rigidity and strength to the wafer of the integrated circuit that uses the standard cell. Using these process steps converts one or more metal nets at the metal zero layer from being used as a floating metal net to being used as a power rail in the standard cell. This conversion decreases the charging and discharging times of corresponding source regions, which increases performance. In the following description, metal layers of a standard cell that uses floating metal nets are shown in FIGS. 1-3. A method is shown in FIG. 4 for creating multiple power rails of a standard cell shorted together using a local interconnect layer of the standard cell. A computing system is shown in FIG. 5 that uses an integrated circuit with floating metal nets converted to power rails.

Turning now to FIG. 1, a generalized block diagram is shown of a top view of metal layers 100 of a standard cell layout utilizing multiple power rails electrically shorted together. The metal layers 100 of the standard cell layout is for an inverter, but in other implementations, the characteristics and techniques used for standard cell layout 100 is used for a variety of other types of Boolean gates and complex gates. Although the metal zero layer 110 is shown, other layers and materials are not shown in the illustration such as the active regions, the local interconnect layers, the metal gate layer, the source and drain regions, other metal layers, vias (or contacts), and so forth. In various implementations, the metal zero layer 110 is a lowest metal layer above the gate region of a transistor. As shown, the standard cell uses multiple power rails of a same reference voltage level. For example, the standard cell uses metal zero layer 110 for providing both VDD 120 and VDD 122, which have a same power supply reference voltage level. Similarly, the standard cell uses metal zero layer 110 for providing both VSS 140 and VSS 142, which have a same ground reference voltage level.

The p-type metal oxide semiconductor (PMOS) field effect transistors FETS (or pfets) are at the top of the metal layers 100 of the standard cell layout. The active region (not shown) used for creating p-type transistors is a silicon substrate doped with Boron or Gallium during a semiconductor fabrication process. The n-type metal oxide semiconductor (NMOS) FETS (or nfets) are at the bottom of the standard cell layout 100. The active region (not shown) used for creating n-type transistors is a silicon substrate doped with Phosphorous or Arsenic during a semiconductor fabrication process. Although the orientation of the metal layers 100 of the standard cell layout is shown to have the p-type transistors at the top and the n-type transistors at the bottom, other orientations are possible and contemplated. As used herein, a "transistor" is also referred to as a "semiconductor device" or a "device."

The metal layers 100 of the standard cell uses the VDD 120 power rail in a top-most metal zero track reserved for power rails. The metal layers 100 of the standard cell also uses the VDD 122 power rail in a track reserved for a floating metal net. Therefore, metal layers 100 do not utilize the VDD 122 power rail in a metal zero track reserved for power rails. The metal layers 100 of the standard cell also uses separate metal zero tracks for the input to the inverter, which is indicated as In 130, and the output of the inverter, which is indicated as Out 132.

The metal layers 100 of the standard cell additionally uses a separate metal zero track for the floating metal net, which is indicated as floating net 150. This floating metal nets has no physical or electrical connection to any power supply reference voltage level or ground reference voltage level. Generally speaking, floating nets provide higher rigidity and strength to the wafer of the integrated circuit that uses the standard cell. Converting floating metal nets in the metal zero layer 110 to power rails, such as VDD 122 and VSS 142, decreases the charging and discharging times of corresponding source regions, which increases performance.

Referring to FIG. 2, a generalized block diagram is shown of a top view of metal layers 200 of a standard cell layout. Layout elements and materials described earlier are numbered identically. The metal layers 200 of the standard cell layout is for an inverter. Similar to the metal layers 100 of a standard cell (of FIG. 1), the PMOS FETs are located at the top of the metal layers 200 of the standard cell layout and the NMOS FETs are located at the bottom of the metal layers 200 of the standard cell layout. Here, no floating metal nets are converted to power rails. The inverter here still uses the same input In 130 and the same output Out 132, but these signals use different metal zero tracks than the metal layers 100 (of FIG. 1). Since no floating metal nets are converted to power rails, the metal layers 200 include more floating metal nets than the metal layers 100 (of FIG. 1). Without converting floating metal nets in the metal zero layer 110 to power rails, the inverter implemented by the metal layers 200 needs increased transistor sizes to reduce the charging and discharging times of corresponding source regions.

Turning now to FIG. 3, a generalized block diagram is shown of a top view of metal layers 300 of a standard cell layout. Layout elements and materials described earlier are numbered identically. The metal layers 300 of the standard cell layout is for an inverter. A schematic of the inverter accompanies the layout. The device 302, which is a PMOS FET is located at the top of the metal layers 300 of the standard cell layout. The device 304, which is an NMOS FET is located at the bottom of the metal layers 300 of the standard cell layout. Here, the standard cell uses multiple power rails of a same reference voltage level. For example, the standard cell uses metal zero layer 110 for providing both VDD 120 and VDD 122, which have a same power supply reference voltage level. Similarly, the standard cell uses metal zero layer 110 for providing both VSS 140 and VSS 142, which have a same ground reference voltage level.

The metal gate 330 and the via 340 provides the received input signal In 130 to both the devices 302 and 304. The source and drain regions of both the p-type device 302 and the n-type device 304 are labeled in the metal layers 300 of the standard cell. The local interconnect layer 310 and the via 320 physically connect the metal zero layers 110 that receive VDD 120 and VDD 122. Similarly, the local interconnect layer 310 and the via 320 physically connect the metal zero layers 110 that receive VSS 140 and VSS 142. The standard cell still uses the floating metal net 370 in the metal zero layer 110.

It is noted that converting floating metal nets to power rails decreases the charging and discharging times of corresponding source regions, which increases performance. This conversion also decreases the resistance between the source region and the corresponding power rail. As shown, the source region of the p-type device 302 has a resistor (a resistance) 350 between the source region and the metal zero layer 110 that provides VDD 120. This resistance is decreased due to being electrically in parallel with the resistor 352 between the source region and the metal zero layer 110 that provides VDD 122. Similarly, the source region of the n-type device 304 has a resistor (a resistance) 360 between the source region and the metal zero layer 110 that provides VSS 140. This resistance is decreased due to being electrically in parallel with the resistor 362 between the source region and the metal zero layer 110 that provides VSS 142.

The decreased equivalent resistance between the source region of the p-type device 302 and the power supply reference voltage level provided by one of VDD 120 and VDD 122 causes the charging and discharging times of the corresponding source region to also reduce. Similarly, the decreased equivalent resistance between the source region of the n-type device 304 and the ground reference voltage level provided by one of VSS 140 and VSS 142 causes the charging and discharging times of the corresponding source region to also reduce.

Referring now to FIG. 4, one embodiment of a method 400 is shown for creating multiple power rails of a standard cell shorted together using a local interconnect layer. For purposes of discussion, the steps in this embodiment are shown in sequential order. However, in other embodiments some steps occur in a different order than shown, some steps are performed concurrently, some steps are combined with other steps, and some steps are absent.

A semiconductor fabrication process forms, in a standard cell of an integrated circuit, a first power connection of a metal zero layer of a standard cell of the integrated circuit (block 402). In various implementations, the metal zero layer is a lowest metal layer above the gate region of a transistor. The semiconductor fabrication process (or process) forms, in the standard cell, a second power connection of the metal zero layer in a track different than a track of the first power connection (block 404). In some implementations, the first power connection is a power supply reference voltage level. In other implementations, the first power connection is a ground reference voltage level.

The process forms, in the standard cell, a signal route of a local interconnect layer such that the signal route is physically connected to each of the first and the second power connections (block 406). The local interconnect layer is below the metal zero layer and at a same layer level as the gate region of the transistor. Each of the local interconnect layer and the first and the second power connections are electrically connected to one another. In various implementations, the local interconnect layer has a physical connection to a source region of a transistor in the standard cell. Therefore, during operation, this source region has current flowing into it from two different power rails when the power rails are connected to a power supply reference voltage level and the source region is a component of a p-type transistor (device). Alternatively, during operation, this source region has current flowing from it toward two different power rails when the power rails are connected to a ground reference voltage level and the source region is a component of an n-type transistor (device).

The process forms, in the standard cell, one or more floating metal nets of the metal zero layer (block 408). These floating metal nets have no physical or electrical connection to any power supply reference voltage level or ground reference voltage level. The one or more floating metal nets of the metal zero layer provide higher rigidity and strength to the wafer of the integrated circuit that uses the standard cell. Using the above process steps converts one or more metal nets at the metal zero layer from being used as a floating metal net to being used to provide one of the power supply reference voltage levels or ground reference voltage levels to one or more transistors in the standard cell. This conversion decreases the charging and discharging times of corresponding source regions, which increases performance. This conversion also decreases the resistance between the source region and the corresponding power rail. The reduced response time of the transistor is accomplished without increasing the size and on-die area of the transistor.

If a potential is not applied to an input node of the standard cell ("no" branch of the conditional block 410), then the standard cell waits for power up (block 412). However, if a potential is applied to the input node of the standard cell ("yes" branch of the conditional block 410), then the circuitry of the standard cell conveys a current from the input node to an output node of the standard cell through one of the two transistors using Cross field effect transistors (block 414).

Referring to FIG. 5, one embodiment of a computing system 500 is shown. The computing system 500 includes the processor 510 and the memory 530. Interfaces, such as a memory controller, a bus or a communication fabric, one or more phased locked loops (PLLs) and other clock generation circuitry, a power management unit, and so forth, are not shown for ease of illustration. It is understood that in other implementations, the computing system 500 includes one or more of other processors of a same type or a different type than processor 510, one or more peripheral devices, a network interface, one or more other memory devices, and so forth. In some implementations, the functionality of the computing system 500 is incorporated on a system on chip (SoC). In other implementations, the functionality of the computing system 500 is incorporated on a peripheral card inserted in a motherboard. The computing system 500 is used in any of a variety of computing devices such as a desktop computer, a tablet computer, a laptop, a smartphone, a smartwatch, a gaming console, a personal assistant device, and so forth.

The processor 510 includes hardware such as circuitry. For example, the processor 510 includes at least one integrated circuit 520, which utilizes standard cells 522 that include two or more power rails for at least one of a power supply reference voltage level and a ground reference voltage level. For example, one or more standard cells 522 instantiated in the integrated circuit 520 use power connections as shown earlier for standard cells 100 and 300 (of FIG. 1 and FIG. 3).

In various implementations, the processor 510 includes one or more processing units. In some implementations, each of the processing units includes one or more processor cores capable of general-purpose data processing, and an associated cache memory subsystem. In such an implementation, the processor 510 is a central processing unit (CPU). In another implementation, the processing cores are compute units, each with a highly parallel data microarchitecture with multiple parallel execution lanes and an associated data storage buffer. In such an implementation, the processor 510 is a graphics processing unit (GPU), a digital signal processor (DSP), or other.

In some implementations, the memory 530 includes one or more of a hard disk drive, a solid-state disk, other types of flash memory, a portable solid-state drive, a tape drive and so on. The memory 530 stores an operating system (OS) 532, one or more applications represented by code 534, and at least source data 536. Memory 530 is also capable of storing intermediate result data and final result data generated by the processor 510 when executing a particular application of code 534. Although a single operating system 532 and a single instance of code 534 and source data 536 are shown, in other implementations, another number of these software components are stored in memory 530. The operating system 532 includes instructions for initiating the boot up of the processor 510, assigning tasks to hardware circuitry, managing resources of the computing system 500 and hosting one or more virtual environments.

Each of the processor 510 and the memory 530 includes an interface unit for communicating with one another as well as any other hardware components included in the computing system 500. The interface units include queues for servicing memory requests and memory responses, and control circuitry for communicating with one another based on particular communication protocols. The communication protocols determine a variety of parameters such as supply voltage levels, power-performance states that determine an operating supply voltage and an operating clock frequency, a data rate, one or more burst modes, and so on.

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu- Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:
   a first signal route of a first metal layer that is a lowest metal layer above a gate region of a standard cell of the integrated circuit;
   a second signal route of the first metal layer in a track different than a track of the first signal route;
   a third signal route of a local interconnect layer below the first metal layer, wherein the third signal route is physically connected to each of the first signal route and the second signal route; and
   wherein responsive to a potential being applied to an input node of the standard cell, a current is conveyed from the input node to an output node of the standard cell through the first signal route, the second signal route, and the third signal route.

2. The integrated circuit as recited in claim 1, wherein the first signal route provides one of a power supply voltage reference level and a ground reference voltage level used by the integrated circuit.

3. The integrated circuit as recited in claim 2, wherein the third signal route has a physical connection to a source region of a transistor in the standard cell.

4. The integrated circuit as recited in claim 2, further comprising one or more tracks of the first metal layer between the first signal route and the second signal route.

5. The integrated circuit as recited in claim 1, further comprising one or more floating signal routes of the first metal layer with no connection to a power supply voltage reference level or a ground reference voltage level used by the integrated circuit.

6. The integrated circuit as recited in claim 1, wherein one or more of the first signal route, the second signal route, and the third signal route are unidirectional signal routes.

7. The integrated circuit as recited in claim 1, wherein the third signal route is orthogonal to the first signal route.

8. A method comprising:
   forming, in an integrated circuit, a first signal route of a first metal layer that is a lowest metal layer above a gate region of a standard cell of the integrated circuit;
   forming, in the integrated circuit, a second signal route of the first metal layer in a track different than a track of the first signal route;
   forming, in the integrated circuit, a third signal route of a local interconnect layer below the first metal layer, wherein the third signal route is physically connected to each of the first signal route and the second signal route; and
   responsive to a potential being applied to an input node of the standard cell, a current is conveyed from the input node to an output node of the standard cell through the first signal route, the second signal route, and the third signal route.

9. The method as recited in claim 8, wherein the first signal route provides one of a power supply voltage reference level and a ground reference voltage level used by the integrated circuit.

10. The method as recited in claim 9, wherein the third signal route has a physical connection to a source region of a transistor in the standard cell.

11. The method as recited in claim 9, further comprising forming, in the integrated circuit, one or more tracks of the first metal layer between the first signal route and the second signal route.

12. The method as recited in claim 8, further comprising forming, in the integrated circuit, one or more floating signal routes of the first metal layer with no connection to a power supply voltage reference level or a ground reference voltage level used by the integrated circuit.

13. The method as recited in claim 8, wherein one or more of the first signal route, the second signal route, and the third signal route are unidirectional signal routes.

14. The method as recited in claim 8, wherein the third signal route is orthogonal to the first signal route.

15. A computing system comprising:
   a memory configured to store instructions of one or more tasks and source data to be processed by the one or more tasks;
   an integrated circuit configured to execute the instructions using the source data, wherein the integrated circuit comprises:
      a first signal route of a first metal layer that is a lowest metal layer above a gate region of a standard cell of the integrated circuit;
      a second signal route of the first metal layer in a track different than a track of the first signal route;
      a third signal route of a local interconnect layer below the first metal layer, wherein the third signal route is physically connected to each of the first signal route and the second signal route; and
      wherein responsive to a potential being applied to an input node of the standard cell, a current is conveyed from the input node to an output node of the standard cell through the first signal route, the second signal route, and the third signal route.

16. The computing system as recited in claim 15, wherein the first signal route provides one of a power supply voltage reference level and a ground reference voltage level used by the integrated circuit.

17. The computing system as recited in claim 16, wherein the third signal route has a physical connection to a source region of a transistor in the standard cell.

18. The computing system as recited in claim 16, wherein the integrated circuit further comprises one or more tracks of the first metal layer between the first signal route and the second signal route.

19. The computing system as recited in claim 15, wherein the integrated circuit further comprises one or more floating signal routes of the first metal layer with no connection to a power supply voltage reference level or a ground reference voltage level used by the integrated circuit.

20. The computing system as recited in claim 15, wherein one or more of the first signal route, the second signal route, and the third signal route are unidirectional signal routes.

* * * * *